United States Patent [19]

Hoshi

[11] Patent Number: 5,111,264
[45] Date of Patent: May 5, 1992

[54] PHOTOELECTRIC CONVERSION DEVICE

[75] Inventor: Junichi Hoshi, Atsugi, Japan

[73] Assignee: Canon Kabushiki Kaisha, Tokyo, Japan

[21] Appl. No.: 740,661

[22] Filed: Aug. 2, 1991

Related U.S. Application Data

[63] Continuation of Ser. No. 563,857, Aug. 8, 1990, abandoned, which is a continuation of Ser. No. 213,919, Jun. 30, 1988, abandoned.

[30] Foreign Application Priority Data

Jul. 3, 1987 [JP] Japan .................................. 62-165522

[51] Int. Cl.⁵ ..................... H01L 27/14; H01L 31/00; H01L 27/10; H01L 27/15
[52] U.S. Cl. ......................................... 357/30; 357/45; 357/71; 357/68
[58] Field of Search ...................... 357/30 H, 30 I, 45, 357/30, 71, 68

[56] References Cited

U.S. PATENT DOCUMENTS

| | | | |
|---|---|---|---|
| 4,758,734 | 7/1988 | Uchida | 357/304 |
| 4,783,691 | 11/1988 | Hasada | 357/30 |
| 4,794,443 | 12/1988 | Hoshi | 357/304 |
| 4,962,412 | 10/1990 | Shinohara et al. | 357/30 |

FOREIGN PATENT DOCUMENTS

| | | | |
|---|---|---|---|
| 0160392 | 11/1985 | European Pat. Off. | 357/30 |
| 0226338 | 6/1987 | European Pat. Off. | 357/30 |
| 58-199557 | 11/1983 | Japan | 357/30 |

*Primary Examiner*—Andrew J. James
*Assistant Examiner*—Stephen D. Meier
*Attorney, Agent, or Firm*—Fitzpatrick, Cella, Harper & Scinto

[57] ABSTRACT

A photoelectric conversion device is provided with plural photoelectric conversion cells and signal lines for activating said photoelectric conversion cells. The signal line is composed of plural lines formed in plural layers. The plural lines are electrically connected to every unit composed of a desired number, at least equal to two, of photoelectric conversion cells.

10 Claims, 4 Drawing Sheets

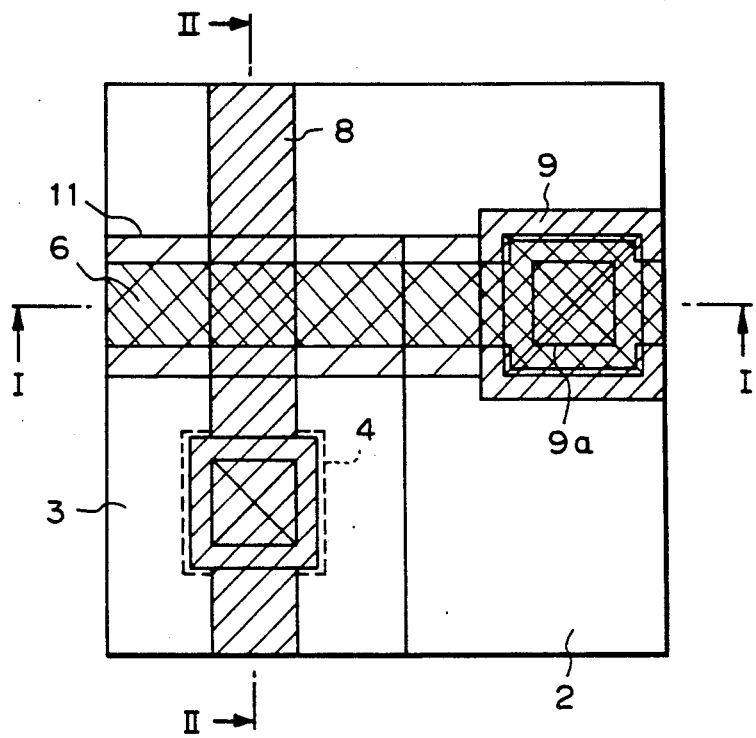
Fig. I(A)
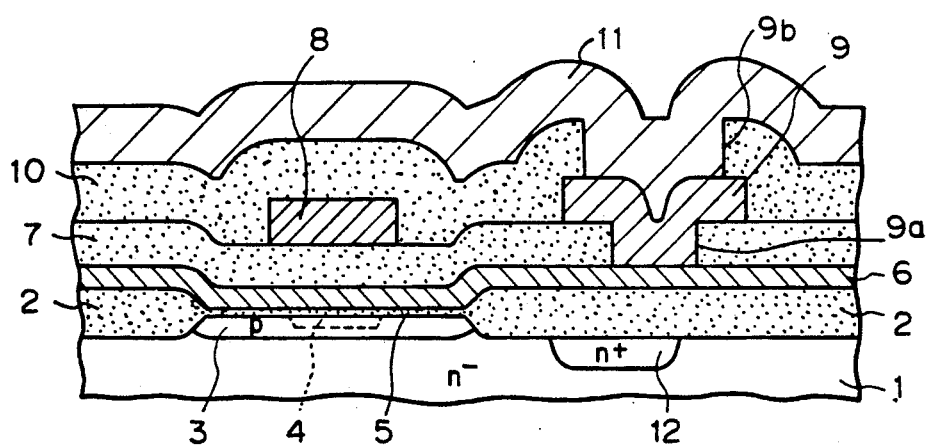
Fig. I(B)

PHOTOELECTRIC CONVERSION DEVICE

This application is a continuation of application Ser. No. 563,857 filed Aug. 8, 1990, which is a continuation of application Ser. No. 213,919 filed June 30, 1988 both now abandoned.

BACKGROUND OF THE INVENTION

1. Field of the Invention

The present invention relates to a photoelectric conversion device having signal lines for activating plural photoelectric conversion cells.

2. Related Background Art

FIGS. 1(A) to 1(C) illustrate photoelectric conversion cells in a conventional photoelectric conversion device.

FIG. 1(A) is a schematic plan view of a photoelectric conversion cell in a conventional photoelectric conversion device; FIG. 1(B) is a cross-sectional view along a line I—I in FIG. 1(A); and FIG. 1(C) is a cross-sectional view along a line II—II in FIG. 1(A).

As shown in these drawings, the photoelectric conversion cells are arranged on an n$^-$ layer 1 formed by epitaxial growth on a substrate, with an element separating area composed of an oxide film 2 formed by the LOCOS method.

On the n$^-$ layer 1 there is formed a p-base area 3 of a bipolar transistor, in which formed is an n$^+$ emitter area 4. On oxide films 2, 5 there is formed a horizontal signal input line 6 which forms, on the p-base area 3, a capacitor electrode for controlling the potential of the base across the oxide film 5. The horizontal signal input line 6 is composed of polysilicon.

In addition, across an insulating layer 7 there is formed a vertical signal output line 8, which is composed of aluminum and is connected to an n$^+$-emitter area 4. In the insulating layer 7 there is formed a contact hole 9a through which the aluminum layer 9 is connected to the horizontal signal input line 6 composed of polysilicon. As the vertical signal output line 8 and the aluminum layer 9 are formed on the insulating layer 7, they will hereafter be called first aluminum layers.

After the formation of an insulating layer 10, a hole 9b is formed on the aluminum layer 9, and an aluminum layer 11 formed parallel to the horizontal signal input line 6 is connected with the aluminum layer 9. The uppermost aluminum layer 11 is electrically connected therewith through the aluminum layer 9.

The above-explained double-layered structure including the aluminum layer 11 of low resistance is adopted for preventing the signal proposition delay, resulting the higher resistance of the horizontal signal input line 6.

The aluminum layer 11, being formed on said first aluminum layer across the insulating layer 10, will be called the second aluminum layer.

FIG. 2 is a schematic view of a conventional photoelectric conversion device consisting of a plurality of the above-explained photoelectric conversion cells.

The above-explained photoelectric conversion cells C1, C2, . . . are arranged as an array, and the horizontal signal input line 6 and and the aluminum layer 11 are formed in a parallel manner and are connected to the cells through the aluminum layer 9. Consequently the horizontal signal can be transmitted without delay even in the case of a large number of cells, so that the signal read-out operation, refreshing operation etc. can be achieved at a high speed.

However, the above-explained conventional photoelectric conversion device has been associated with a drawback that the aperture ratio cannot be increased, because the aluminum layer 9 constituting the connection portion in the above-explained double-layered structure occupies about 11% of each cell area. The aperture ratio is the ratio between the effective photo-receiving area of the photoelectric device and the whole area thereof. In conventional devices, since the aluminum layer 9 serving as the connecting portion is opaque to light, the conventional structure having the aluminum layer 9 in each cell cannot increase the aperture ratio.

Such drawback is not limited to the above-explained conventional structure but appears also in various photoelectric conversion devices such as of CCD, MOS or SIT structure, as long as the double-layered structure is employed.

SUMMARY OF THE INVENTION

An object of the present invention is to provide a photoelectric conversion device not associated with the above-explained drawback.

Another object of the present invention is to provide a photoelectric conversion device having plural layers of signal lines without the loss in the aperture ratio.

Still another object of the present invention is to provide a photoelectric conversion device having signal lines for activating plural photoelectric conversion cells, wherein the signal lines are formed in the form of plural lines structured in plural layers, and said plural lines are electrically connected to each unit consisting of two or more photoelectric conversion cells.

DETAILED DESCRIPTION OF THE PREFERRED EMBODIMENTS

The present invention will be clarified in detail by the embodiments thereof shown in the attached drawings, but it is not limited to these embodiments.

Figure 3:
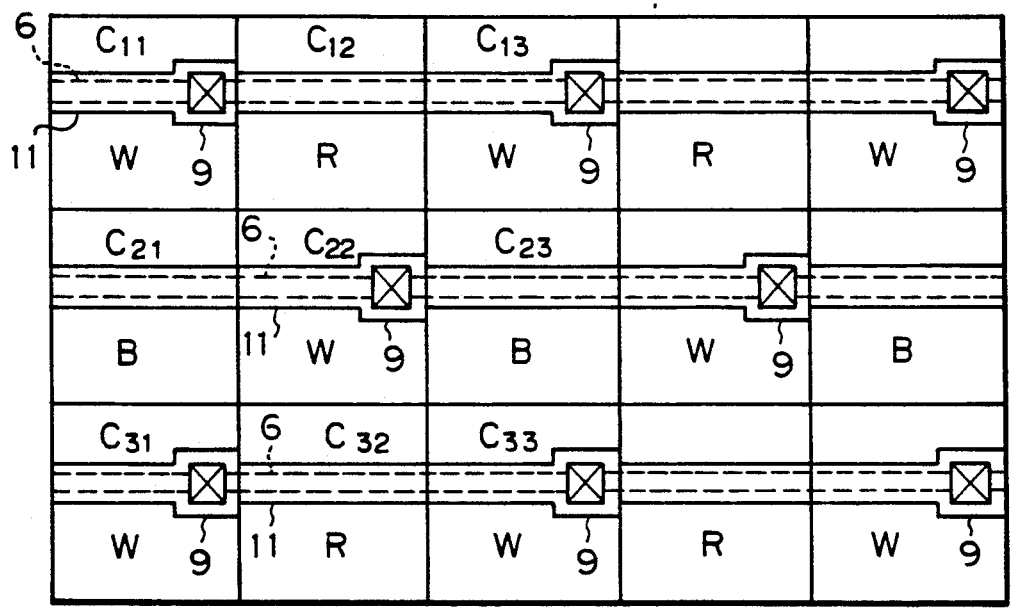
FIG. 3 is a schematic view of a photoelectric conversion device constituting a first preferred embodiment of the present invention.

FIG. 3 is a schematic view of a first preferred embodiment of the photoelectric conversion device of the present invention.

Figure 1:
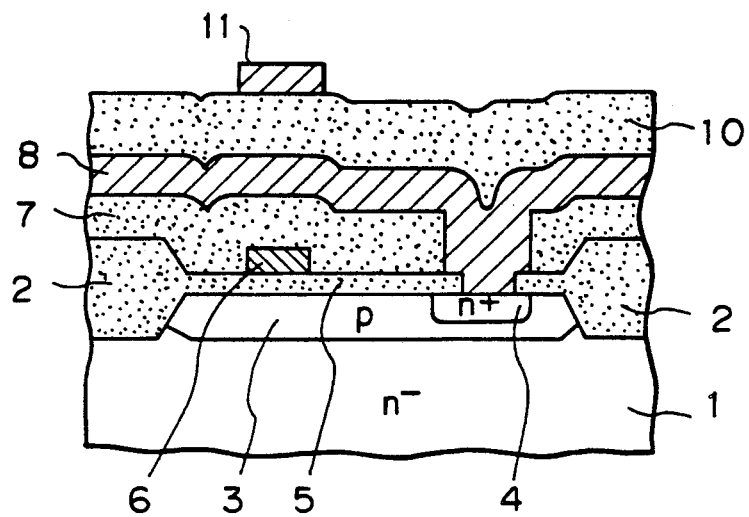
FIG. 1(A) is a schematic plan view of a photoelectric conversion cell in a conventional photoelectric conversion device.
FIG. 1(B) is a cross-sectional view along a line I—I in FIG. 1(A)
FIG. 1(C) is a cross-sectional view along a line II—II in FIG. 1(A)
Figure 2:
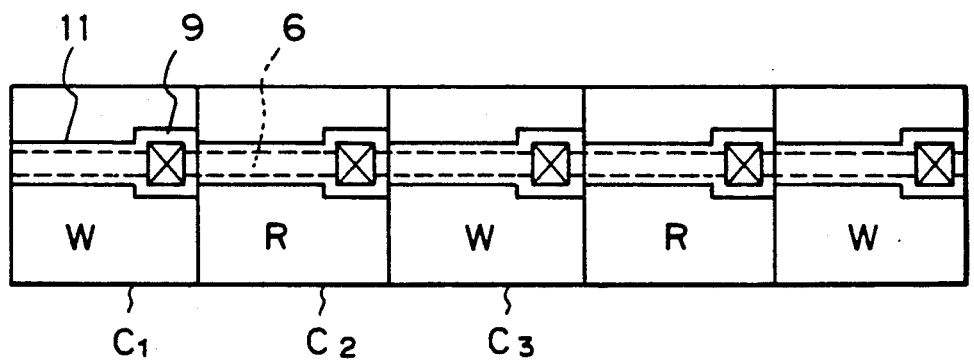
FIG. 2 is a schematic view showing an example of the conventional photoelectric conversion device containing an array of plural photoelectric conversion cells explained above.

In FIG. 3, the photoelectric conversion cells $C_{11}$, $C_{12}, \ldots, C_{21}, C_{22}, \ldots$ have a basic structure same as that shown in FIG. 1 and are arranged two-dimensionally. The cells are respectively provided with a white filter having a substantially uniform spectral transmission over the entire visible spectral range, a red color separation filter (R) or a blue color separation filter (B).

In the present embodiment, FIG. 3, the horizontal signal input line 6 composed of polysilicon and the aluminum layer 11 are connected only on the white (W) cell, and the red (R) and blue (B) cells do not have the opaque aluminum layer 9. Consequently the aperture ratio for each pixel, composed of white, red and blue cells, is increased in comparison with the conventional technology.

The cells with the white filters can receive a larger amount of light in comparison than the cells with either the red or blue filters, so that the effect on the output signal can be made smaller, even in the presence of the aluminum layer 9 constituting the connecting portion in the white cell in comparison to the red or blue cells. Consequently the sensitivity or S/N ratio of the device is not deteriorated.

The connecting portion need not be formed for every two cells as in the above-explained embodiment, but can be formed for every three or four cells. However the interval of the connecting portions should be maintained at a value not causing the delay of the signal, since otherwise the horizontal signal input line 6 of polysilicon will show a high resistance.

Figure 4:
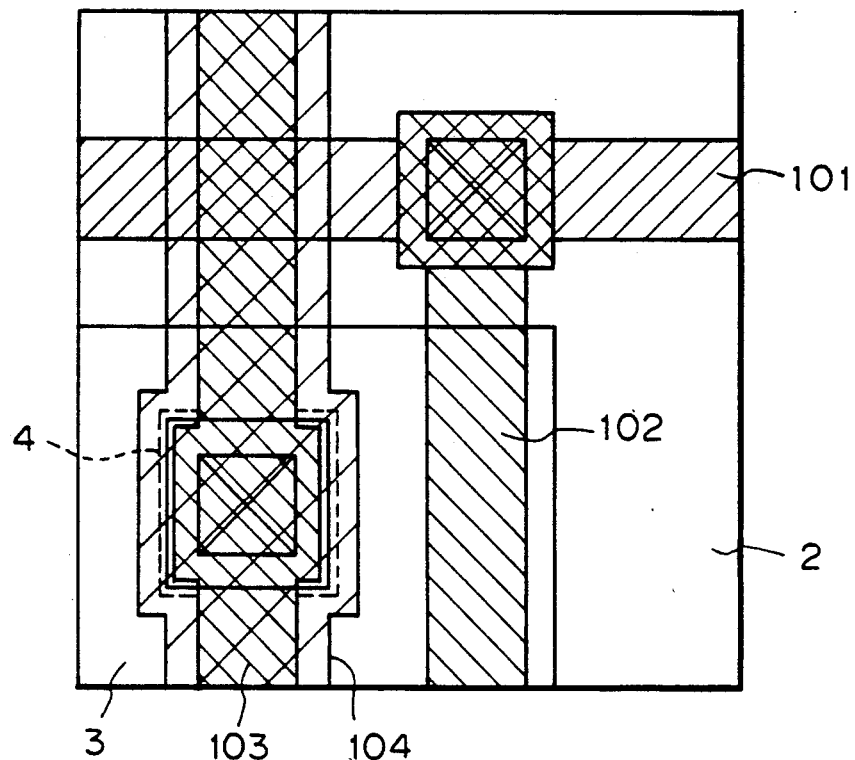
FIG. 4 is a schematic plan view of a photoelectric conversion cell constituting a second preferred embodiment of the present invention.

FIG. 4 is a schematic plan view of photoelectric conversion cells of a second preferred embodiment of the present invention.

In the present embodiment, a horizontal signal input line 101 is formed as a first aluminum layer 101, which is connected through a contact hole to an underlying capacitor electrode 102 of polysilicon.

A vertical signal output line 103 is composed of polysilicon and is connected with an n+ emitter area 4. Also an aluminum layer 104 is formed as a second aluminum layer parallel to the vertical signal output line 103 of polysilicon, and is connected on the emitter area 4.

Figure 5:
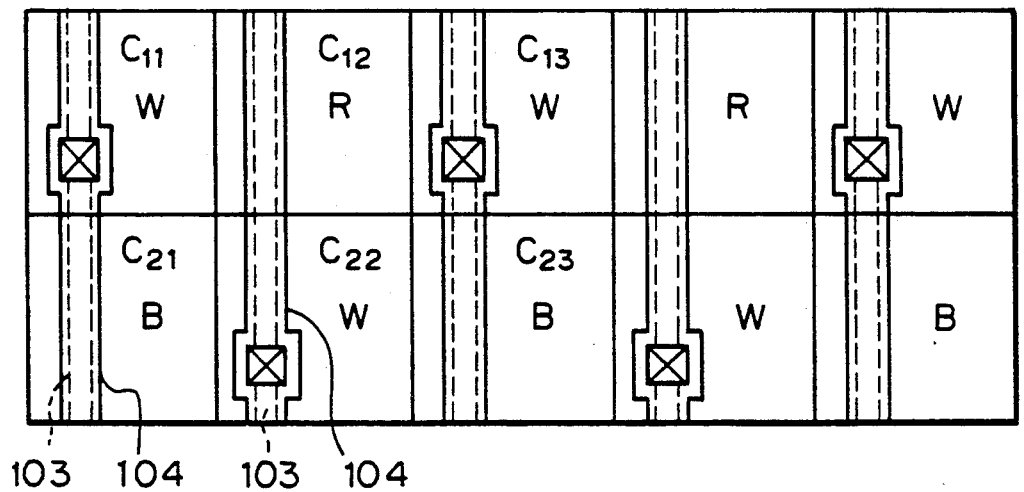
FIG. 5 is a schematic view of a photoelectric conversion device having a two-dimensional array of a plurality of the photoelectric conversion cells mentioned above.

FIG. 5 is a schematic plan view of the second preferred embodiment of the present invention in which the above-explained photoelectric conversion cells are arranged two-dimensionally. The horizontal signal input lines 101 and the capacitor electrodes 102 are omitted.

In the present embodiment, the vertical signal output lines 103 and the aluminum layers 104 are are mutually connected only on the cells having the white filter, whereby the loss in the aperture rate is prevented.

In the present embodiment the vertical signal output line 103 is connected with the upper most aluminum layer 104, thereby reducing the resistance and the capacitance in the wiring, and improving the S/N ratio of the output signal.

The color separation filters need not be composed of red and blue only but can be composed of red, green and blue. In such case the connection can be made only in the green cells showing higher sensitivity. Naturally the color separation filters are not limited to the above-mentioned combinations.

As detailedly explained in the foregoing, the photoelectric conversion device of the present invention is capable of suppressing the loss in the aperture ratio, since plural lines formed in laminated plural layers are connected to every unit composed of two or more cells thus constituting a signal line.

I claim:

1. A photoelectric conversion device comprising:
   a plurality of first photoelectric conversion cells corresponding to a plurality of filters of relatively high light transmittance;
   a plurality of second photoelectric conversion cells corresponding to a plurality of filters of relatively low light transmittance; and
   signal lines comprising a plurality of laminated layers connected for driving said first and second photoelectric conversion cells, wherein a contact for electrical connection between the plurality of layers is provided within a region of said first photoelectric conversion cells corresponding to the filter of relatively high light transmittance.

2. A photoelectric conversion device according to claim 1, wherein each of said signal lines comprise a low resistivity layer and a high resistivity layer.

3. A photoelectric conversion device according to claim 2, wherein said low resistivity layer is made of aluminum.

4. A photoelectric conversion device according to claim 2, wherein said high resistivity layer comprises a polysilicon.

5. A photoelectric conversion device according to claim 1, wherein said contact is provided for all of said first and second photoelectric conversion cells.

6. A photoelectric conversion device according to claim 5, wherein all of said first and second photoelectric conversion cells are provided with color separation filters, and said contact is provided on an area of said first and second photoelectric conversion cells corresponding to color separation filters of a predetermined color.

7. A photoelectric conversion device according to claim 1, wherein each of said first photoelectric conversion cells comprise a brightness sensing cell, and the filters of relatively low light transmittance are color separation filters.

8. A photoelectric conversion device according to claim 1, wherein the filters of relatively high light transmittance have a substantially uniform spectral transmission over the visible spectrum.

9. A photoelectric conversion device according to claim 8, wherein the filters of relatively high light transmittance are white filters.

10. A photoelectric conversion device according claim 1, wherein the filters of relatively high light transmittance are green filters.

* * * * *

UNITED STATES PATENT AND TRADEMARK OFFICE
CERTIFICATE OF CORRECTION

PATENT NO. : 5,111,264
DATED : May 5, 1992
INVENTOR(S) : JUNICHI HOSHI

It is certified that error appears in the above-identified patent and that said Letters Patent is hereby corrected as shown below:

COLUMN 1

Line 29, "formed is" should read --is formed--.
    Line 53, "proposition" should be deleted.
    Line 54, "resulting" should read --resulting from--.
    Line 64, "and and" should read --and--.

COLUMN 3

Line 4,  "white filter" should read --white filter (W)--.
    Line 17, "than" should read --to--.
    Line 51, "are are" should read --are--.
    Line 53, "rate" should read --ratio--.
    Line 55, "upper most" should read --uppermost--.

COLUMN 4

Line 27, "comprise" should read --comprises--.
    Line 47, "comprise" should read --comprises--.

Signed and Sealed this

Thirty-first Day of August, 1993

*Attest:*

BRUCE LEHMAN

*Attesting Officer*   *Commissioner of Patents and Trademarks*